(12) United States Patent
Nilson

(10) Patent No.: US 9,520,893 B1
(45) Date of Patent: Dec. 13, 2016

(54) ARCHITECTURE FOR ENSURING MONOTONICITY IN A DIGITAL-TO-ANALOG CONVERTER

(71) Applicant: AVNERA CORPORATION, Beaverton, OR (US)

(72) Inventor: Christopher D. Nilson, San Jose, CA (US)

(73) Assignee: AVNERA CORPORATION, Beaverton, OR (US)

( * ) Notice: Subject to any disclaimer, the term of this patent is extended or adjusted under 35 U.S.C. 154(b) by 0 days.

(21) Appl. No.: 15/067,500

(22) Filed: Mar. 11, 2016

(51) Int. Cl.
- H03M 1/06 (2006.01)
- H03M 1/66 (2006.01)
- G05F 3/26 (2006.01)
- H03M 1/00 (2006.01)
- H03M 1/74 (2006.01)
- H03M 1/12 (2006.01)

(52) U.S. Cl.
CPC ............... *H03M 1/66* (2013.01); *G05F 3/262* (2013.01); *H03M 1/00* (2013.01); *H03M 1/12* (2013.01); *H03M 1/747* (2013.01)

(58) Field of Classification Search
CPC ........... H03M 1/747; H03M 1/00; H03M 1/12
USPC ................. 341/144, 118, 120, 121
See application file for complete search history.

(56) References Cited

U.S. PATENT DOCUMENTS

2004/0257058 A1* 12/2004 Hirata ............... G05F 3/22
                                                    323/313
2005/0093729 A1   5/2005 Lin et al.

* cited by examiner

*Primary Examiner* — Joseph Lauture
(74) *Attorney, Agent, or Firm* — Marger Johnson (57) ABSTRACT

A current-mode, digital-to-analog converter (DAC) configured to convert a digital word input having j bits to an analog signal. The DAC has $2^j$ current sources, an output node, a current divider, a first switch, and a second switch. Each of the $2^j$ current sources is configured to produce a current having a value $I_0$. The current divider has a programmable divide ratio, d, where 1/d is between 0 and 1. The first switch is configured to selectively couple $2^j-1$ of the $2^j$ current sources to the output node. One of the $2^j$ current sources is not coupled to the output node. The second switch is configured to selectively couple each of the 2j current sources to the current divider. This architecture ensures that the fundamental transform of input code to output current always has a slope that does not change from positive to negative or from negative to positive.

20 Claims, 7 Drawing Sheets

FIG. 1

Conventional

FIG. 2

Conventional

FIG. 3

Conventional

FIG. 4

Conventional

ARCHITECTURE FOR ENSURING MONOTONICITY IN A DIGITAL-TO-ANALOG CONVERTER

FIELD OF THE INVENTION

This disclosure is directed to circuit design of a digital-to-analog converter (DAC), and, more particularly, to an apparatus and method for ensuring monotonicity in a DAC.

BACKGROUND

A digital-to-analog converter, or DAC, converts a digital input into an analog output signal, such as a current or voltage. The digital input may be, for example, a digital word. There are several conventional architectures used for DACs.

Figure 1:
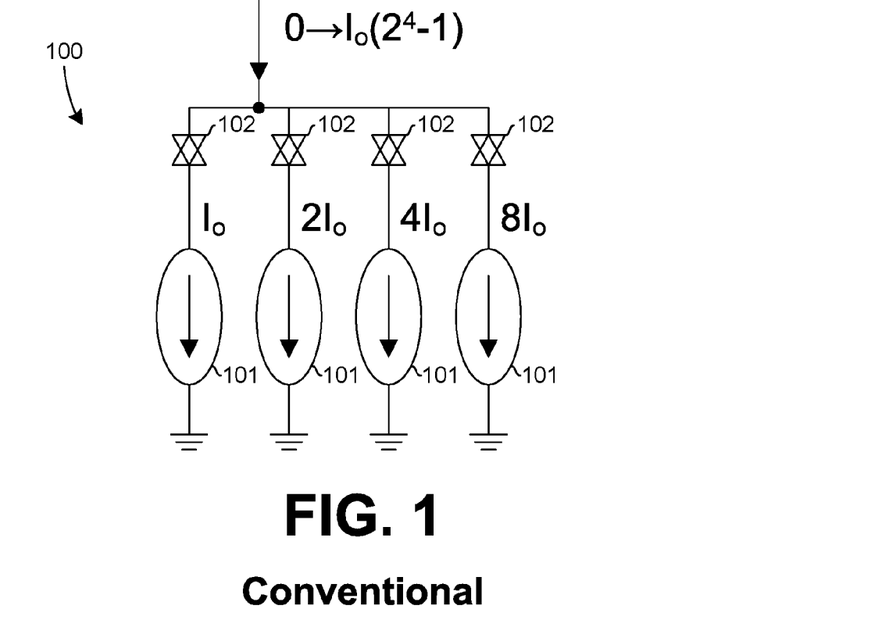
FIG. 1 is a schematic block diagram that shows the general architecture a conventional form of a binary-weighted, current-mode, digital-to-analog converter (DAC).

FIG. 1 shows the general architecture for a conventional form of a binary-weighted, current-mode, DAC 100. Such a DAC includes n binary-weighted current sources 101, where n is the number of bits in the DAC 100. Each current source 101 is controlled by a switch 102, such as a transmission gate. Hence, in the four-bit example of FIG. 1, four binary-weighted copies of the least-significant element, represented by the current $I_0$, are added to the output in any combination, under the control of a four-bit digital input word. Thus, the output may vary from 0 to $I_0 \times (2^4-1)$.

But there is a significant drawback with the architecture 100 in FIG. 1. That is, any of the weighted sources 101 can be in error by a particular error factor. Consequently, for certain error factors, the slope of the current-vs-code characteristic could reverse. If the slope changes from positive to negative, or vice versa, then the current-vs-code function is not monotonic. For example, if the $8I_0$ source in FIG. 1 is 15% low, then the outputs for codes 7 and 8 will be $7I_0$ and $6.8I_0$ instead of $7I_0$ and $8I_0$. Since $6.8I_0$ is less than $7I_0$, then the slope of the function will have decreased whereas the function should have increased to $8I_0$.

In general, the overall matching requirement for monotonicity is that the error factor must be less than the quotient of the least-significant bit divided by the most-significant bit. Non-monotonicity may cause harmonic distortion in DACs used for analog signals, and it can also defeat other algorithms, such as an algorithm for offset correction. This matching problem limits binary DACs that are like the DAC illustrated in FIG. 1 to about eight bits of resolution.

Figure 2:
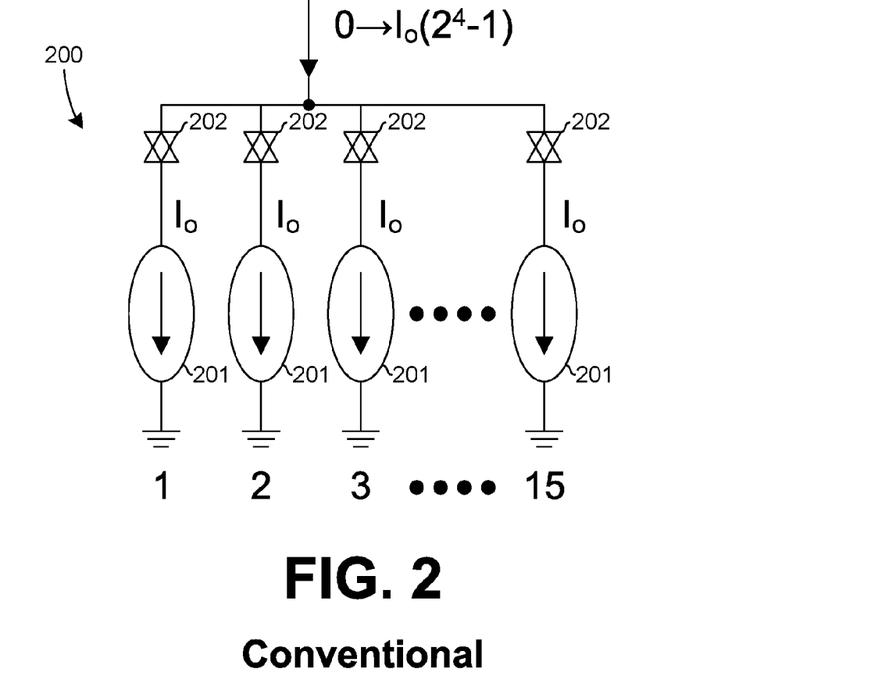
FIG. 2 is a schematic block diagram that shows the general architecture of a conventional form of a thermometer-coded, current-mode DAC.

One conventional way of ensuring monotonicity is to utilize a thermometer-coded, current-mode DAC 200, such as the four-bit example depicted in FIG. 2. The thermometer-coded, current-mode DAC 200 includes $2^n-1$ current sources 201, where n is the number of bits in the DAC 200. Each current source 201 is controlled by a switch 202, such as a transmission gate. Each current source 201 provides a current with a value equal to $I_0$, the least-significant bit. Accordingly, and as shown in FIG. 2, a single copy of $I_0$ is added to the output for each increase in code. Because none of the copies can be negative, monotonicity is ensured. This solution, however, requires a large amount of overhead, in the form of decoding logic and switching, to control the $2^n-1$ copies of $I_0$. Thus, like the architecture 100 of FIG. 1, DACs with the architecture 200 of FIG. 2 are also usually limited to 8 bits or less.

Figure 3:
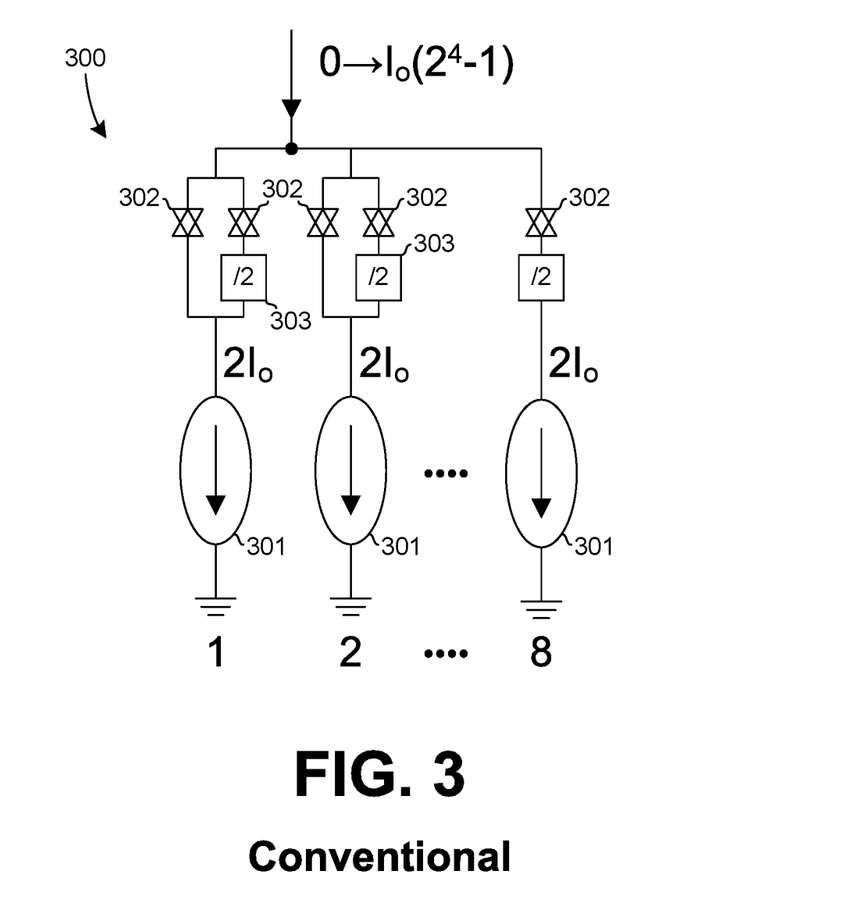
FIG. 3 is a schematic block diagram that shows the general architecture a conventional form of a thermometer-coded, current-mode DAC, with a divider for each thermometer segment.

A combination of a thermometer-coded architecture with other architectures can be used to relieve the tradeoff between overhead and matching for monotonicity. For example, as shown in FIG. 3, a conventional form of a thermometer-coded, current-mode DAC 300 may include a divider 303 for each current source 301. Except for the divider for the highest code, each divider 303 is controlled by two switches 302, which may be, for example, transmission gates. The divider for the highest code, code 8 in the example of FIG. 3, is controlled by a single switch 302 or transmission gate.

In the architecture of FIG. 3, when activated, the leftmost switch in the illustrated pair of switches 302 for each segment allows the full $2I_0$ current to pass to the output. When activated, the rightmost switch for each segment allows the full $2I_0$ current to pass to the divider. If neither switch is activated in the pair of switches 302, essentially none of the $2I_0$ current for that segment passes to the output. Hence, in the four-bit example of FIG. 3, $2^{n-1}$ copies of $2I_0$ are controlled by thermometer logic segments. Each copy is followed by a divider 303 to divide the current by two. Therefore, the output of each segment can be 0, $I_0$, or $2I_0$ by operation of the switches 302.

Since the dividers 303 do not create scaled copies of $I_0$, but only split it into portions, monotonicity is still ensured with this architecture 300. Only half of the $2I_0$ unit sources and logic are required as compared to the full thermometer DAC, such as the DAC 200 of FIG. 2. Note that the $2I_0$ copy for the highest code, code 8 in the example of FIG. 3, is never switched fully to the output in this binary example. Thus, the output of the last segment can be 0 or $I_0$, but not $2I_0$.

Figure 4:
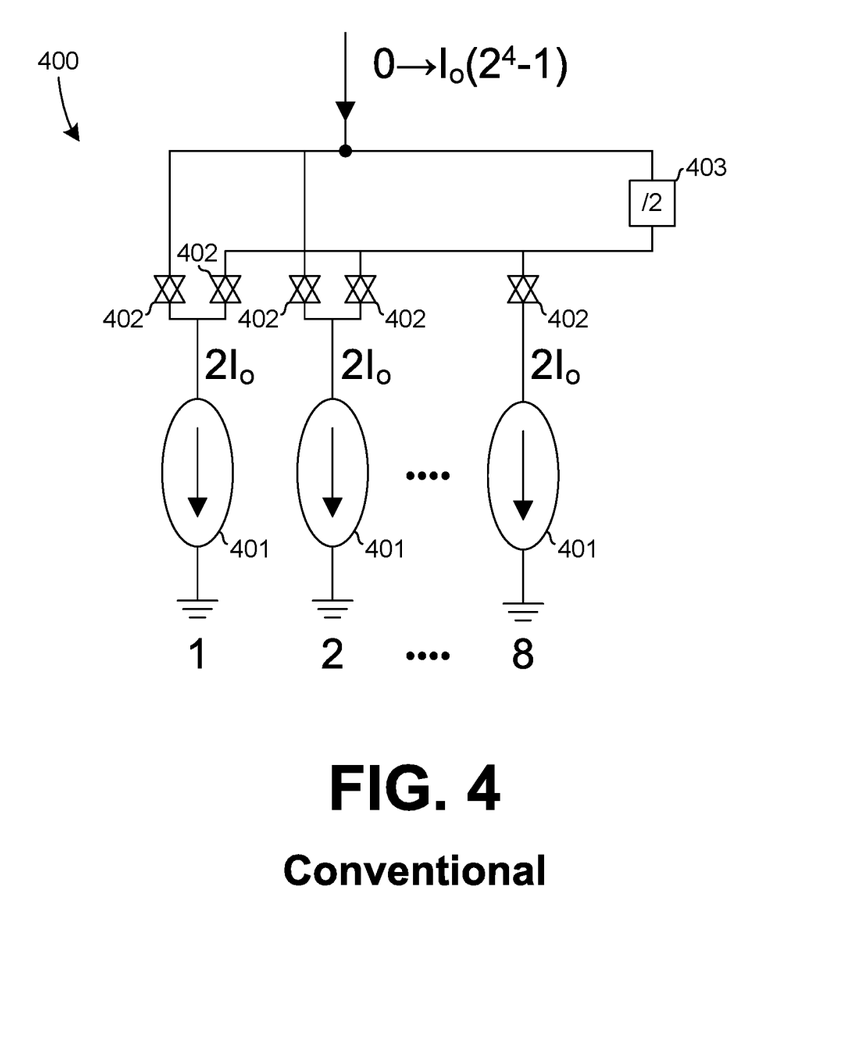
FIG. 4 is a schematic block diagram that shows the general architecture a conventional form of a thermometer-coded, current-mode DAC, with a single divider operating on each thermometer segment.

The architecture 300 of FIG. 3 can be simplified to use a single divider since only one copy of $2I_0$ is treated at a time. Thus, as shown in FIG. 4, a conventional form of a thermometer-coded, current-mode DAC 400 may include a single divider 403 that operates on each current source 401. Except for the current source for the highest code, each current source 401 is controlled by two switches 402 or transmission gates. The current source for the highest code, code 8 in the example of FIG. 4, is controlled by a single switch 402 or transmission gate. The switches operate generally as described above for FIG. 3.

The architectures of FIGS. 3 and 4, though, suffer from a limited set of possible resolution values, dependent only on the number of bits in the DAC 300 or the DAC 400.

Embodiments of the invention address these and other issues in the prior art.

SUMMARY OF THE DISCLOSURE

Embodiments of the disclosed subject matter provide an apparatus and method for ensuring that the fundamental transform of digital input code to analog output current for a current-mode, digital-to-analog converter (DAC) always has a slope that does not change from positive to negative or from negative to positive. Accordingly, embodiments of the disclosed subject matter ensure monotonicity in the DAC.

Thus, at least some embodiments of a current-mode, digital-to-analog converter (DAC) that is configured to convert a digital word input having j bits to an analog signal may include $2^j$ current sources, an output node, a current divider, a first switch, and a second switch. Each of the $2^j$ current sources is configured to produce a current having a value $I_0$. The current divider has a programmable divide ratio, d, where $1/d$ is between 0 and 1. The first switch is configured to selectively couple $2^j-1$ of the $2^j$ current sources to the output node. One of the $2^j$ current sources is not coupled to the output node. The second switch is configured to selectively couple each of the 2j current sources to the current divider.

In another aspect, at least some embodiments of a binary divider circuit having k bits may include a current mirror and a current source. The current mirror has a first transistor and a second transistor. Each transistor has a source, and the source of the first transistor is electrically connected to the source of the second transistor. The first transistor has a programmable gain n, where n is greater than or equal to 1. The second transistor has a programmable gain m, where the sum of n plus m equals $2^k$, where k is the number of bits in the divider circuit.

In yet another aspect, at least some embodiments of a method of dividing a current with a programmable current mirror having k bits may include coupling a current source, producing a current, $I_0$, to the current mirror. The current mirror has a first transistor and a second transistor. Each transistor has a source, and the source of the first transistor is electrically coupled to the source of the second transistor. The first transistor and the second transistor each has a programmable gain. The method may also include: configuring the programmable gain of the first transistor to a value n, where n is greater than or equal to 1; configuring the programmable gain of the second transistor to a value m, where $m=2^k-n$; and outputting a divided current from the programmable current mirror, the divided current being $I_0 \times (m/(n+m))$.

In still another aspect, at least some embodiments of a method of dividing a current within a DAC configured to convert a digital word input having j bits to an analog signal may include selectively coupling each of $2^j$ current sources to an input side of a current divider. An output side of the current divider is coupled to an output node of the DAC, and each of the $2^j$ current sources produces a current having a value $I_0$. Also, the current divider has a programmable divide ratio, d, where 1/d is between 0 and 1. The method may further include selectively coupling $2^j-1$ of the $2^j$ current sources to the output node of the DAC. One of the $2^j$ current sources is not coupled to the output node.

DETAILED DESCRIPTION

As described herein, embodiments of the invention are directed to an architecture for a current-mode, digital-to-analog converter (DAC) that ensures that the fundamental transform of input code to output current always has a slope that does not change from positive to negative or from negative to positive. In other words, if the slope of the transform is positive, the slope will remain greater than or equal to zero as the code increases. Also, if the slope of the transform is negative, the slope will remain less than or equal to zero as the code increases.

Embodiments of the invention may be applied to binary DACs, and examples of this are shown and described, but the invention may also be used with other electronic circuits, including other, non-binary DACs. Additionally, the disclosed architectures may be implemented as one or more integrated circuits.

Figure 5:
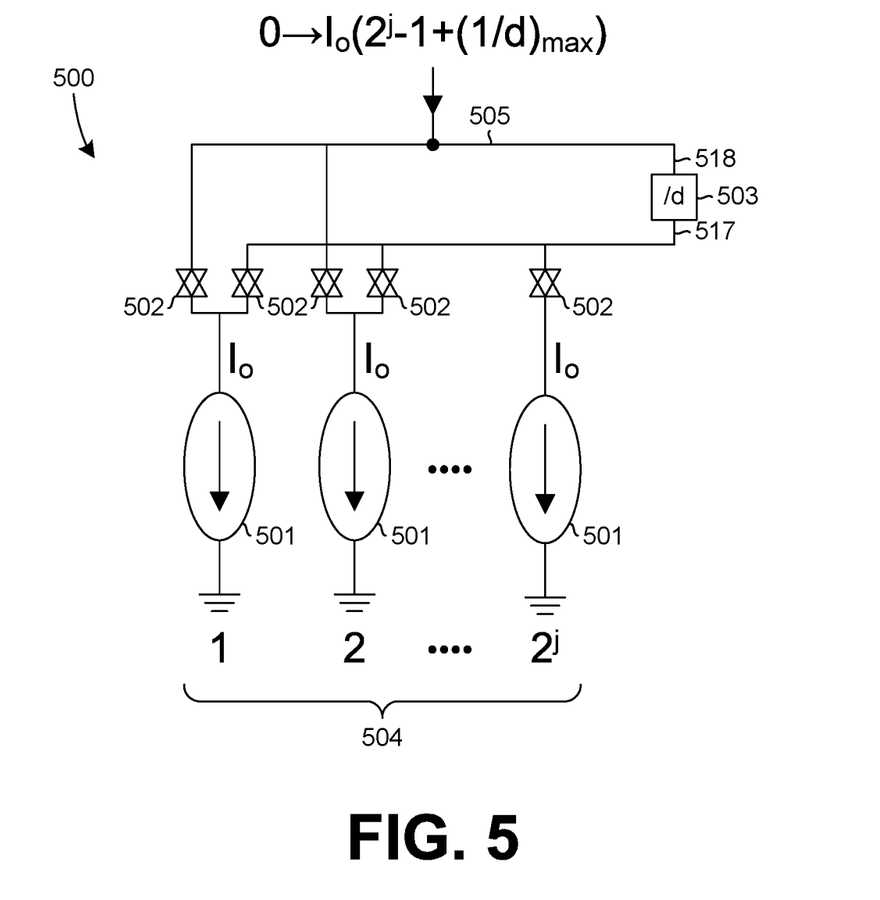
FIG. 5 is a functional schematic diagram of a DAC that includes a variable divider with a programmable divide ratio, according to embodiments of the invention.

FIG. 5 is a functional diagram showing material portions of an architecture for ensuring monotonicity in a DAC, according to embodiments of the invention. As illustrated in FIG. 5, an architecture 500 may include $2^j$ thermometer-coded segments 504, where j is the number of bits in a digital word input to the DAC for conversion to an analog signal. The architecture 500 may also include a variable divider 503 having a programmable divide ratio, 1/d, between 0 and 1. That is, an input to the variable divider 503 is multiplied by the programmable divide ratio, 1/d, to produce an output of the variable divider 503.

Each of the thermometer-coded segments 504 includes a current source 501 coupled or connected to ground at a node of the current source 501, and each current source 501 provides a current with a value equal to $I_0$, where $I_0$ is the least-significant bit, at another node of the current source 501.

Each of the first $2^j-1$ current sources 501 is also coupled or connected to a pair of switches 502 or transmission gates. A first switch of the pair of switches 502, such as the leftmost switch in each pair illustrated in FIG. 5, allows current to pass between the respective current source and an output node 505 of the DAC. A second switch of the pair of switches 502 allows current to pass between the respective current source and the variable divider 503, before passing to the output 505 of the DAC. As shown in FIG. 5, the $2^{j-th}$ current source, which is the rightmost current source in the example illustrated in FIG. 5, includes only one switch 502 or transmission gate, which allows current to pass between the $2^{j-th}$ current source and the variable divider 503. Thus, the $2^{j-th}$ current source is not connected directly to the output 505 of the DAC in the configuration illustrated in FIG. 5. As used in this disclosure, "j-th" is intended to mean the ordinal number assigned to an item "j" in a sequence.

Thus, in the architecture of FIG. 5, when activated the leftmost switch in the pair of switches 502 for $2^j-1$ of the segments 504 allows the $I_0$ current to pass to the DAC output 505. When activated, the rightmost switch for $2^j-1$ of the segments 504 allows the $I_0$ current to pass to the divider 503, and the output of the divider 503 passes to the DAC output 505. If neither switch 502 is activated in a segment's pair, essentially none of the $I_0$ current for that segment 504 passes to the DAC output 505. For one of the $2^j$ segments 504, when activated the corresponding switch 502 allows the $I_0$ current to pass to the DAC output 505 through the divider 503, and there is no connection directly to the output 505 of the DAC. In this way, $2^j-1$ of the segments 504 may pass either 0, $I_0$, or a portion of $I_0$ current to the DAC output 505, where the portion depends on the divide ratio of the variable divider 503. Likewise, one of the $2^j$ segments 504 may pass either 0 or a portion of $I_0$ current to the DAC output 505.

Thus, the output of the DAC 500 can vary between 0 and $I_0((2^j-1)+(1/d)_{max})$, where $(1/d)_{max}$ is the maximum divide ratio of the variable divider 503. As one example, if the variable divider 503 is programmed or otherwise set to divide an input current by four, then the divide ratio is 1/4.

Accordingly, a method of dividing current within a DAC 500 may include selectively connecting each of $2^j$ current sources 501 to an input side, or node, 517 of a current divider 503, each of the $2^j$ current sources 501 producing a current having a value $I_0$, and the current divider 503 having a programmable divide ratio, d, where 1/d is between 0 and 1, an output side 518 of the current divider 503 being connected to an output node 505 of the DAC; and selectively connecting $2^j-1$ of the $2^j$ current sources 501 to the output node 505 of the DAC, in which one of the $2^j$ current sources 501 is not connected to the output node 505. The method may also include iteratively reconfiguring the current divider 503 to have a programmable divide ratio, $d_{new}$, where $1/d_{new}$ is between 0 and 1 and $d_{new}$ does not equal d. Once the current divider is reconfigured, the method may include again selectively connecting each of $2^j$ current sources to the input side 517 of the current divider 503; and again selectively connecting $2^j-1$ of the $2^j$ current sources 501 to the output node 505 of the DAC, in which one of the $2^j$ current sources 501 is not connected to the output node 505.

Figure 6:
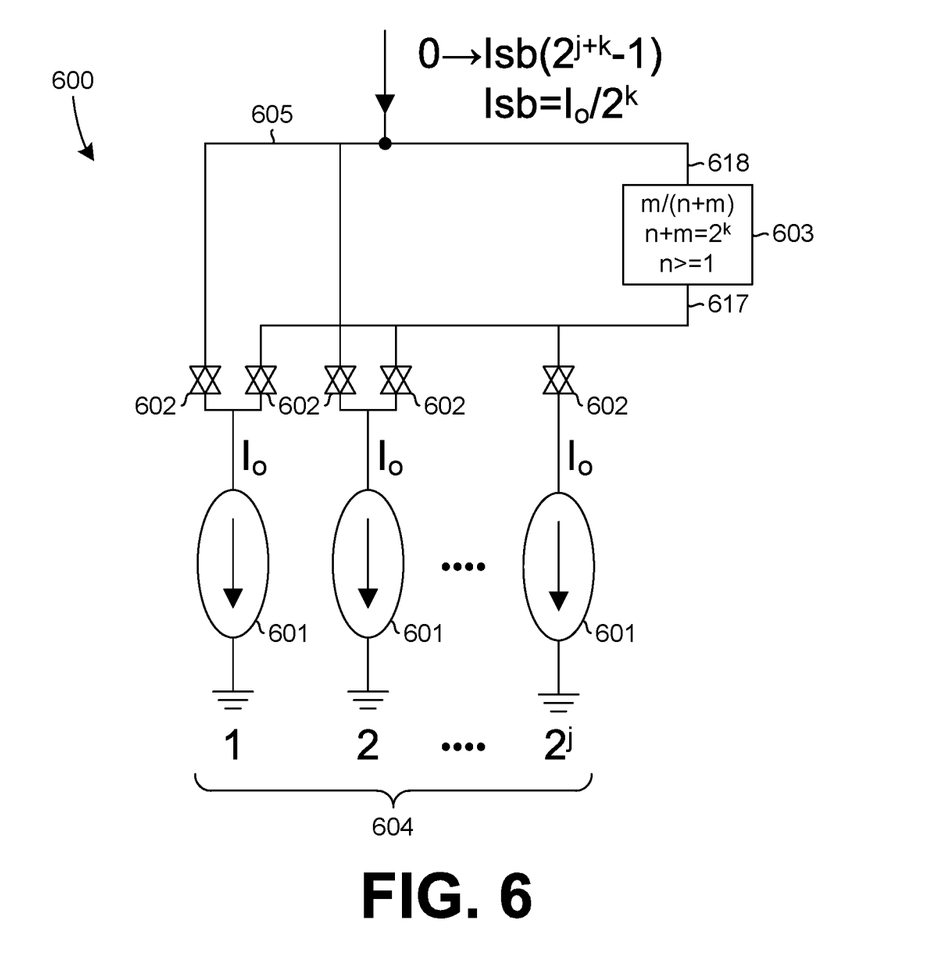
FIG. 6 is a functional schematic diagram of a DAC that includes a binary, k-bit divider with a programmable divide ratio, according to embodiments of the invention.

FIG. 6 is a functional diagram showing material portions of an architecture 600 for ensuring monotonicity in a DAC, according to embodiments of the invention. The architecture 600 of FIG. 6 may be a particular case of the architecture 500 of FIG. 5, where the variable divider 503 of FIG. 5 is binary and has k bits. As noted above, though, the DAC architecture need not be binary in all embodiments.

Thus, as illustrated in FIG. 6, the architecture 600 may include $2^j$ thermometer-coded segments 604, where j is the number of bits in a digital word input to the DAC for conversion to an analog signal. The architecture 600 may also include a divider 603 having k bits and a programmable divide ratio. Hence, the DAC 600 is binary with j+k bits.

Each of the thermometer-coded segments 604 includes a current source 601 connected to ground, and each current source 601 provides a current with a value equal to $I_0$, where $I_0$ is the value of the least-significant bit (LSB) multiplied by $2^k$.

As in FIG. 5, each of the first $2^j-1$ current sources 601 of FIG. 6 is also connected to a pair of switches 602 or transmission gates. A first switch of the pair of switches 602, such as the leftmost switch in each pair illustrated in FIG. 6, allows current to pass between the respective current source 601 and an output 605 of the DAC. A second switch of the pair of switches 602, such as the rightmost switch in each pair illustrated in FIG. 6, allows current to pass between the respective current source 601 and the programmable divider 603, before passing to the output 605 of the DAC. As shown in FIG. 6, the $2^{j-th}$ current source, which is the rightmost current source 601 in the example of FIG. 6, includes only one switch 602 or transmission gate, which allows current to pass between the $2^{j-th}$ current source and the programmable divider 603. Thus, the $2^{j-th}$ current source is not connected directly to the output 605 of the DAC in the configuration illustrated in FIG. 6.

Thus, in the architecture of FIG. 6, when activated the leftmost switch in the pair of switches 602 for $2^j-1$ of the segments 604 allows the $I_0$ current to pass to the DAC output 605. When activated, the rightmost switch for $2^j-1$ of the segments 604 allows the $I_0$ current to pass to the divider 603, and the output of the divider 603 passes to the DAC output 605. If neither switch 602 is activated in a segment's pair, essentially none of the $I_0$ current for that segment 604 passes to the DAC output 605. For one of the $2^j$ segments 604, when activated the corresponding switch 602 allows the $I_0$ current to pass to the DAC output 605 through the divider 603, and there is no connection directly to the output 605 of the DAC. In this way, $2^j-1$ of the segments 604 may pass either 0, $I_0$, or a portion of $I_0$ current to the DAC output 605, where the portion depends on the divide ratio of the programmable divider 603. Likewise, one of the $2^j$ segments 604 may pass either 0 or a portion of $I_0$ current to the DAC output 605.

As noted above, the divider 603 has k bits and a programmable divide ratio. As shown in FIG. 6, the divide ratio may be m/(n+m), where n is greater than or equal to 1 and m is $2^k-n$. In other words, the sum n+m is constrained to be equal to $2^k$. For a binary divider 603, n and m are integers. As noted above, though, the DAC need not be binary in all embodiments. Thus, in embodiments where the DAC has a non-binary divider, n and m need not be integers as long as n is greater than or equal to 1 and m is the difference of n subtracted from an arbitrary constant, such as $2^k$.

Accordingly, a method of dividing current within a DAC 600 may include selectively connecting each of $2^j$ current sources 601 to an input side 617 of a current divider 603, each of the $2^j$ current sources 601 producing a current having a value $I_0$, and the current divider 603 having a programmable divide ratio m/(n+m), where n is greater than or equal to 1 and $m=2^k-n$, an output side 618 of the current divider 603 being connected to an output node 605 of the DAC; and selectively connecting $2^j-1$ of the $2^j$ current sources 601 to the output node 605 of the DAC, in which one of the $2^j$ current sources 601 is not connected to the output node 605. The method of dividing current within a DAC 600 may also include reconfiguring the current divider 603 to have a programmable divide ratio $m_{new}/(n_{new}+m_{new})$, where $n_{new}$ is greater than or equal to 1, $n_{new}$ does not equal n, and $m_{new}=2^k-n_{new}$. Once the current divider is reconfigured, the method may include again selectively connecting each of $2^j$ current sources 601 to the input side 617 of the current divider 603; and again selectively connecting $2^j-1$ of the $2^j$ current sources 601 to the output node 605 of the DAC, in which one of the $2^j$ current sources 601 is not connected to the output node 605. The method may further include iteratively reconfiguring the current divider 603 for a plurality of values of $n_{new}$ and $m_{new}$, and perhaps each value of $n_{new}$ and $m_{new}$, for which $m_{new}+n_{new}=2^k$.

Thus, the divided output of each segment 604 is a fraction of $I_0$ from 0 to $(2^k-1)/2^k$, and the output 605 of the DAC 600 can vary between 0 and $LSB(2^{j+k}-1)$.

Figure 7:
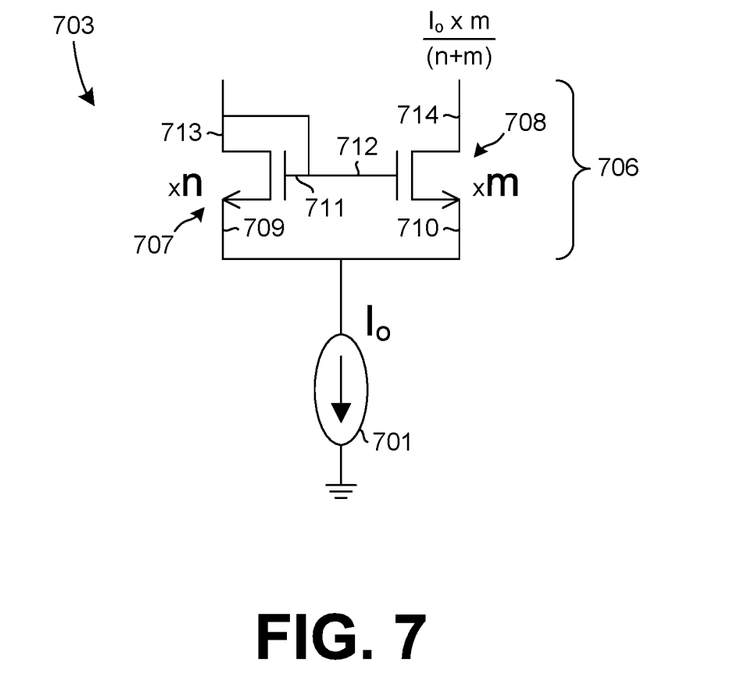
FIG. 7 is a functional schematic diagram of a generalized current divider, according to embodiments of the invention.

FIG. 7 is a functional diagram showing material portions of a generalized current divider 703, according to embodiments of the invention. The current divider 703 may be, for example, an implementation of the current divider 603 of FIG. 6. As illustrated in FIG. 7, the current divider 703 may be a binary divider circuit having k bits, although the divider may be non-binary in some embodiments. The current divider 703 may include a current mirror 706 and a current source 701. The current source 701 is connected to ground and provides a current with a value of $I_0$.

The current mirror 706 includes a first transistor 707 and a second transistor 708. As an example, each transistor may be a metal-oxide-semiconductor, field-effect transistor (MOSFET) transistor with a source, a drain, and a gate as illustrated in FIG. 7. Even so, other transistors may be used in some embodiments. The source 709 of the first transistor 707 and the source 710 of the second transistor 708 are electrically connected together and to the current source 701. Thus, neither source is connected directly to ground. The gate 711 of the first transistor 707 and the gate 712 of the second transistor 708 are connected together and to the drain 713 of the first transistor 707. The first transistor 707 has a programmable gain n, where n is greater than or equal to 1. The second transistor 708 has a programmable gain m, where $n+m=2^k$.

Accordingly, the current at the drain 714 of the second transistor 708 is $(I_0 \times m)/(n+m)$. To put it another way, the current at the drain 714 of the second transistor 708 is a programmable fraction of $I_0$ from 0 to $(2^k-1)/2^k$. In this way, the current mirror 706 splits the current $I_0$ into portions controlled by the relative size of the first transistor 707 and the second transistor 708.

Accordingly, a method of dividing a current with a programmable current mirror 706 having k bits may include connecting a current source 701, which produces a current, $I_0$, to the current mirror 706; configuring a programmable gain of the first transistor 707 to a value n, where n is greater than or equal to 1; configuring a programmable gain of the second transistor 708 to a value m, where $m=2^k-n$; and outputting a divided current from the programmable current mirror 706, the divided current being $I_0 \times (m/(n+m))$. The method may also include reconfiguring the programmable gain of the first transistor 707 to a value $n_{new}$, where $n_{new}$ is greater than or equal to 1 and $n_{new}$ does not equal n; and reconfiguring the programmable gain of the second transistor 708 to a value $m_{new}$, where $m_{new}=2^k-n_{new}$ and $m_{new}$ does not equal m. Additionally, the method may further include iteratively reconfiguring the programmable gain of the first transistor 707 and iteratively reconfiguring the programmable gain of the second transistor 708, for a plurality of values of $n_{new}$ and $m_{new}$, and perhaps each value of $n_{new}$ and $m_{new}$, for which $m_{new}+n_{new}=2^k$.

Figure 8:
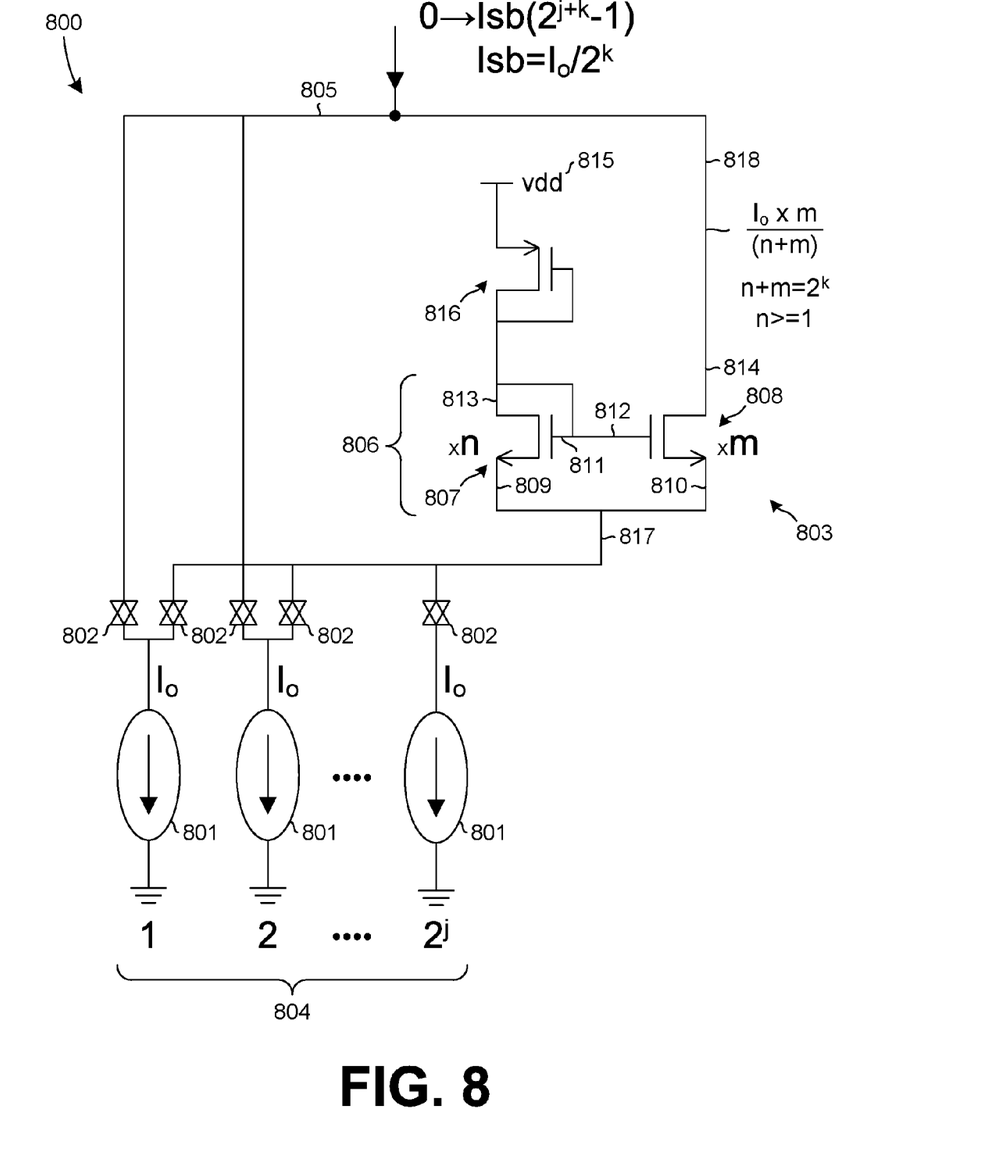
FIG. 8 is a functional schematic diagram of an architecture that combines the DAC of FIG. 6 with the current divider of FIG. 7, according to embodiments of the invention.

FIG. 8 is a functional diagram showing material portions of an architecture 800 for ensuring monotonicity in a DAC, according to embodiments of the invention. The architecture 800 combines a current divider, such as the current divider 703 of FIG. 7, with a thermometer-coded, DAC, such as the DAC 600 of FIG. 6. As illustrated in FIG. 8, the architecture 800 may include $2^j$ thermometer-coded segments 804, where j is the number of bits in a digital word input to the DAC for conversion to an analog signal. The architecture 800 may also include a current divider 803 having k bits and a programmable divide ratio. Hence, the DAC 800 is binary with j+k bits.

Each of the thermometer-coded segments 804 includes a current source 801 connected to ground, and each current source 801 provides a current with a value equal to $I_0$, where $I_0$ is the value of the least-significant bit (LSB) multiplied by $2^k$.

As in FIG. 6, each of the first $2^j-1$ current sources 801 of FIG. 8 is also connected to a pair of switches 802 or transmission gates. A first switch of the pair of switches 802, such as the leftmost switch in each pair illustrated in FIG. 8, allows current to pass between the respective current source 801 and an output 805 of the DAC. A second switch of the pair of switches 802, such as the rightmost switch in each pair illustrated in FIG. 8, allows current to pass between the respective current source 801 and the current divider 803, before passing to the output 805 of the DAC. As shown in FIG. 8, the $2^{j-th}$ current source, which is the rightmost current source 801 in the example of FIG. 6, includes only one switch 802 or transmission gate, which allows current to pass between the $2^{j-th}$ current source and the current divider 803. Thus, the $2^{j-th}$ current source 801 is not connected directly to the output 805 of the DAC in the configuration illustrated in FIG. 8.

Consequently, in the architecture of FIG. 8, when activated the leftmost switch in the pair of switches 802 for $2^j-1$ of the segments 804 allows the $I_0$ current to pass to the DAC output 805. When activated, the rightmost switch for $2^j-1$ of the segments 804 allows the $I_0$ current to pass to the current divider 803, and the output of the current divider 803 passes to the DAC output 805. If neither switch 802 is activated in a segment's pair, essentially none of the $I_0$ current for that segment passes to the DAC output 805. For one of the $2^j$ segments 804, when activated the corresponding switch 802 allows the $I_0$ current to pass to the DAC output 805 through the current divider 803, and there is no connection directly to the output 805 of the DAC. In this way, $2^j-1$ of the segments 804 may pass either 0, $I_0$, or a portion of $I_0$ current to the DAC output 805, where the portion depends on the divide ratio of the current divider 803. Likewise, one of the $2^j$ segments 804 may pass either 0 or a portion of $I_0$ current to the DAC output 805.

The current divider 803 may include a current mirror 806. As with the current mirror 806 of FIG. 7, the current mirror 806 may include a first transistor 807 and a second transistor 808. Each transistor may be a metal-oxide-semiconductor, field-effect transistor (MOSFET) transistor with a source, a drain, and a gate. The source 809 of the first transistor 807 and the source 810 of the second transistor 808 are connected together and to the current source 801. The gate 811 of the first transistor 807 and the gate 812 of the second transistor 808 are connected together and to the drain 813 of the first transistor 807. The first transistor 807 has a programmable gain n, where n is greater than or equal to 1. The second transistor 808 has a programmable gain m, where $n+m=2^k$. The drain 813 of the first transistor 807 may be connected to a power supply, $V_{dd}$, 815, and the connection may be through a third transistor 816 as illustrated in FIG. 8. Hence, a first, unused portion of $I_0$ is shunted to the power supply 815 while a second, used portion of $I_0$ is added to the DAC output 805.

Accordingly, the current at the drain 814 of the second transistor 808 is $(I_0 \times m)/(n+m)$. In other words, the current at the drain 814 of the second transistor 808 is a programmable fraction of $I_0$ from 0 to $(2^k-1)/2^k$. In this way, the current mirror 806 splits the current $I_0$ into two portions controlled by the relative gains of the first transistor 807 and the second transistor 808. The DAC is guaranteed to be monotonic because $I_0$ is being split, but not scaled and copied, by the architecture 800.

Accordingly, a method of dividing a current within a DAC 800 may include selectively connecting each of $2^j$ current sources 801 to an input side 817 of a current divider 803, the current divider 803 including a first transistor 807 having a programmable gain of n, where n is greater than or equal to 1, and a second transistor 808 having a programmable gain of m, where $m=2^k-n$, an output side 818 of the current divider 803 being connected to an output node 805 of the DAC, each of the $2^j$ current sources 801 producing a current having a value $I_0$, the current divider 803 having a programmable divide ratio, d, where 1/d is between 0 and 1; selectively connecting $2^j-1$ of the $2^j$ current sources 801 to the output node 805 of the DAC, in which one of the $2^j$ current sources 801 is not connected to the output node 805; and outputting a divided current from the current divider 803, the divided current being $I_0 \times (m/(n+m))$. The method of dividing a current within a DAC 800 may also include reconfiguring the programmable gain of the first transistor

807 to a value $n_{new}$, where $n_{new}$ is greater than or equal to 1 and $n_{new}$ does not equal n; reconfiguring the programmable gain of the second transistor 808 to a value $m_{new}$, where $m_{new}=2^k-n_{new}$ and $m_{new}$ does not equal m; and outputting a new divided current from the current divider 803, the new divided current being $I_0\times(m_{new}/(n_{new}+m_{new}))$. Additionally, the method may further include iteratively reconfiguring the programmable gain of the first transistor 807 and iteratively reconfiguring the programmable gain of the second transistor 808, for a plurality of values of $n_{new}$ and $m_{new}$, and perhaps each value of $n_{new}$ and $m_{new}$, for which $m_{new}+n_{new}=2^k$.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this disclosure to mean that other components, features, steps, processes, operations, etc. are optionally present. For example, an article "comprising" or "which comprises" components A, B, and C can contain only components A, B, and C, or it can contain components A, B, and C along with one or more other components.

Also, directions such as "right" and "left" are used for convenience and in reference to the diagrams provided in figures. But the disclosed subject matter may have a number of orientations in actual use or in different implementations. Thus, a feature that is vertical, horizontal, to the right, or to the left in the figures may not have that same orientation or direction in all implementations.

Although specific embodiments of the invention have been illustrated and described for purposes of illustration, it will be understood that various modifications may be made without departing from the spirit and scope of the invention. Accordingly, the invention should not be limited except as by the appended claims.

The invention claimed is:

1. A binary divider circuit having K bits, the divider circuit comprising:
 a current mirror having a first transistor and a second transistor, each transistor having a source, the source of the first transistor being electrically connected to the source of the second transistor, the first transistor having a programmable gain N, where N is greater than or equal to 1, the second transistor having a programmable gain M, where the sum of N plus M equals $2^K$, where K is the number of bits in the divider circuit; and
 a current source electrically connected to the source of the first transistor and the source of the second transistor, the current source configured to produce a current $I_0$.

2. The divider circuit of claim 1, the first transistor and the second transistor each further having a gate and a drain, in which the gate of the first transistor is electrically connected to the gate of the second transistor, and in which the gate of the first transistor and the gate of the second transistor are electrically connected to the drain of the first transistor.

3. The divider circuit of claim 1, in which the current source is connected to the source of the first transistor and the source of the second transistor at a node of the current source, and in which the current source is further connected to ground at another node of the current source.

4. A digital-to-analog converter (DAC) configured to convert a digital word input having J bits to an analog signal, the DAC comprising:
 $2^J$ current sources, in which each of the $2^J$ current sources is configured to produce a current having a value $I_0$;
 an output node;
 a current divider having a programmable divide ratio, D, where 1/D is between 0 and 1;
 a first switch configured to selectively couple $2^J-1$ of the $2^J$ current sources to the output node, in which one of the $2^J$ current sources is not coupled to the output node; and
 a second switch configured to selectively couple each of the $2^J$ current sources to the current divider.

5. The DAC of claim 4, in which the programmable divide ratio is M/(N+M), where N is greater than or equal to 1 and $M=2^K-N$.

6. The DAC of claim 4, in which the current divider has K bits and includes a current mirror, the current mirror further having a first transistor and a second transistor, each transistor having a source, the source of the first transistor being electrically coupled to the source of the second transistor, the first transistor having a programmable gain N, where N is greater than or equal to 1, the second transistor having a programmable gain M, where $M=2^K-N$.

7. The DAC of claim 6, in which the source of the first transistor and the source of the second transistor define a common source, in which the first transistor and the second transistor each further have a gate and a drain, in which the gate of the first transistor is electrically coupled to the gate of the second transistor, in which the gate of the first transistor and the gate of the second transistor are electrically coupled to the drain of the first transistor, and in which the current mirror is configured to have a current gain M/(N+M) from the common source of the first transistor and the second transistor to the drain of the second transistor.

8. The DAC of claim 4, further comprising a power supply electrically coupled to the drain of the first transistor.

9. The DAC of claim 8, in which the power supply is coupled to the drain of the first transistor through a third transistor.

10. A method of dividing a current with a programmable current mirror having K bits, the method comprising:
 coupling a current source, producing a current, $I_0$, to the current mirror, the current mirror having a first transistor and a second transistor, each transistor having a source, the source of the first transistor being electrically coupled to the source of the second transistor, the first transistor having a programmable gain, the second transistor having a programmable gain;
 configuring the programmable gain of the first transistor to a value N, where N is greater than or equal to 1;
 configuring the programmable gain of the second transistor to a value M, where $M=2^K-N$; and
 outputting a divided current from the programmable current mirror, the divided current being $I_0\times(M/(N+M))$.

11. The method of claim 10, further comprising:
 reconfiguring the programmable gain of the first transistor to a value $N_{new}$, where $N_{new}$ is greater than or equal to 1 and $N_{new}$ does not equal N; and reconfiguring the programmable gain of the second transistor to a value $M_{new}$, where $M_{new}=2^K-N_{new}$ and $M_{new}$ does not equal M.

12. The method of claim 11, further comprising iteratively reconfiguring the programmable gain of the first transistor and iteratively reconfiguring the programmable gain of the second transistor, for a plurality of values of $N_{new}$ and $M_{new}$ where $M_{new}+N_{new}=2^K$.

13. A method of dividing a current within a digital-to-analog converter (DAC) configured to convert a digital word input having J bits to an analog signal, the method comprising:

selectively coupling each of $2^J$ current sources to an input side of a current divider, an output side of the current divider being coupled to an output node of the DAC, each of the $2^J$ current sources producing a current having a value $I_0$, the current divider having a programmable divide ratio, D, where 1/D is between 0 and 1; and selectively coupling $2^J-1$ of the $2^J$ current sources to the output node of the DAC, in which one of the $2^J$ current sources is not coupled to the output node.

14. The method of claim 13, further comprising iteratively reconfiguring the current divider to have another programmable divide ratio, $D_{new}$, where $1/D_{new}$ is between 0 and 1 and $D_{new}$ does not equal D, before:

again selectively coupling each of $2^J$ current sources to the input side of the current divider; and again selectively coupling $2^J-1$ of the $2^J$ current sources to the output node of the DAC, in which one of the $2^J$ current sources is not coupled to the output node.

15. The method of claim 13, in which the programmable divide ratio, D, is M/(N+M), where N is greater than or equal to 1 and $M=2^K-N$.

16. The method of claim 15, further comprising reconfiguring the current divider to have another programmable divide ratio $M_{new}/(N_{new}+M_{new})$, where $N_{new}$ is greater than or equal to 1, $N_{new}$ does not equal N, and $M_{new}=2^K-N_{new}$, before:

again selectively coupling each of $2^J$ current sources to the input side of the current divider; and again selectively coupling $2^J-1$ of the $2^J$ current sources to the output node of the DAC, in which one of the $2^J$ current sources is not coupled to the output node.

17. The method of claim 16, further comprising iteratively reconfiguring the current divider for a plurality of values of $N_{new}$ and $M_{new}$ where $M_{new}+N_{new}=2^K$.

18. The method of claim 13, in which the current divider includes a first transistor having a programmable gain of N, where N is greater than or equal to 1, and a second transistor having a programmable gain of M, where $M=2^K-N$, the method further comprising outputting a divided current from the current divider, the divided current being $I_0 \times (M/(N+M))$.

19. The method of claim 18, further comprising:

reconfiguring the programmable gain of the first transistor to a value $N_{new}$, where $N_{new}$ is greater than or equal to 1 and $N_{new}$ does not equal N;

reconfiguring the programmable gain of the second transistor to a value $M_{new}$, where $M_{new}=2^K-N_{new}$ and $M_{new}$ does not equal M; and outputting a new divided current from the current divider, the new divided current being $I_0 \times (M_{new}/(N_{new}+M_{new}))$.

20. The method of claim 19, further comprising iteratively reconfiguring the programmable gain of the first transistor and iteratively reconfiguring the programmable gain of the second transistor, for a plurality of values of $N_{new}$ and $M_{new}$ where $M_{new}+N_{new}=2^K$.

* * * * *